United States Patent
Lechner et al.

(10) Patent No.: US 10,639,999 B2
(45) Date of Patent: May 5, 2020

(54) METHOD AND CIRCUIT FOR DETECTING AN OPEN LINE OF THE SINE/COSINE RECEIVER COIL OF A RESOLVER

(71) Applicant: Robert Bosch GmbH, Stuttgart (DE)

(72) Inventors: Benjamin Lechner, Neuhausen (DE); Daniel Zirkel, Wiernsheim-Serres (DE); Daniel Raichle, Vaihingen (DE); Michael Ungermann, Darmstadt (DE)

(73) Assignee: Robert Bosch GmbH, Stuttgart (DE)

( * ) Notice: Subject to any disclaimer, the term of this patent is extended or adjusted under 35 U.S.C. 154(b) by 347 days.

(21) Appl. No.: 15/737,440

(22) PCT Filed: Jun. 7, 2016

(86) PCT No.: PCT/EP2016/062853
§ 371 (c)(1),
(2) Date: Dec. 18, 2017

(87) PCT Pub. No.: WO2016/202632
PCT Pub. Date: Dec. 22, 2016

(65) Prior Publication Data
US 2018/0111485 A1     Apr. 26, 2018

(30) Foreign Application Priority Data
Jun. 18, 2015   (DE) .................. 10 2015 211 232

(51) Int. Cl.
*B60L 3/00*     (2019.01)
*G01D 5/22*     (2006.01)
(Continued)

(52) U.S. Cl.
CPC .......... *B60L 3/0038* (2013.01); *B60L 3/0061* (2013.01); *G01B 7/30* (2013.01); *G01D 1/08* (2013.01);
(Continued)

(58) Field of Classification Search
None
See application file for complete search history.

(56) References Cited

U.S. PATENT DOCUMENTS 2,258,837 A * 10/1941 Zuschlag ........... G01N 27/9046
324/232
2,552,721 A * 5/1951 King .................... H03F 3/66
331/65

(Continued)

FOREIGN PATENT DOCUMENTS

CN     101629984 A     1/2010
CN     102242679 A     11/2011
(Continued)

OTHER PUBLICATIONS

International Search Report for Application No. PCT/EP2016/062853 dated Aug. 31, 2016 (English Translation, 3 pages).

*Primary Examiner* — Tung S Lau
(74) *Attorney, Agent, or Firm* — Michael Best & Friedrich LLP

(57) ABSTRACT

A method for detecting an open line (10) of a receiver coil (17; 18) of a resolver (16) comprises—providing a pull-up resistor ($R_1$; $R_3$) and a pull-down resistor ($R_2$; $R_4$) at the terminals (7a, 7b; 8a, 8b) on a control device (1) for the signal lines (13a, 13b; 14a, 14b) of the receiver coil (17; 18);—measuring the voltage between the two signal line terminals (7a, 7b; 8a, 8b) of the receiver coil at two sampling times provided symmetrically at the middle of the excitation period;—calculating an offset value by calculating an average value that comprises the measured values measured at the two sampling times in an excitation period; and—identifying an open line (10) if the offset value exceeds a threshold value.

7 Claims, 2 Drawing Sheets

(51) Int. Cl.
  *G01D 18/00* (2006.01)
  *G01B 7/30* (2006.01)
  *G01D 1/08* (2006.01)
  *G01D 1/10* (2006.01)
  *G01R 19/25* (2006.01)
  *G01R 21/133* (2006.01)

(52) U.S. Cl.
  CPC .............. *G01D 1/10* (2013.01); *G01D 5/2233* (2013.01); *G01D 5/2291* (2013.01); *G01D 18/00* (2013.01); *G01R 19/25* (2013.01); *G01R 21/133* (2013.01)

(56) References Cited

U.S. PATENT DOCUMENTS

| | | | | |
|---|---|---|---|---|
| 2,781,468 A | * | 2/1957 | Adler | H04N 5/53 313/411 |
| 3,265,983 A | * | 8/1966 | Kalfaian | H04B 1/64 330/123 |
| 3,400,219 A | * | 9/1968 | Jahns | H04M 11/007 379/102.01 |
| 3,968,850 A | * | 7/1976 | Gaskill | G01G 7/04 177/210 R |
| 5,223,789 A | * | 6/1993 | Katsuyama | G01R 19/15 324/117 R |
| 2003/0006761 A1 | | 1/2003 | Hiramatsu et al. | |
| 2014/0142782 A1 | | 5/2014 | Fu et al. | |

FOREIGN PATENT DOCUMENTS

| | | | | |
|---|---|---|---|---|
| CN | 202752183 | * | 6/2012 | ............... B06B 1/02 |
| DE | 102009020431 | | 11/2009 | |
| DE | 102011078583 | | 1/2013 | |
| EP | 0080701 A1 | * | 6/1983 | ............. F02P 9/007 |
| EP | 2078933 | | 7/2009 | |
| JP | 2013059258 | | 3/2013 | |
| JP | 2013117473 | | 6/2013 | |

* cited by examiner

METHOD AND CIRCUIT FOR DETECTING AN OPEN LINE OF THE SINE/COSINE RECEIVER COIL OF A RESOLVER

BACKGROUND OF THE INVENTION

The invention relates to a method for detecting an open line of the sinusoidal coil or the cosinusoidal coil of a resolver and a circuit for implementing this method.

Resolvers are used for determining the angular position of a rotating object, e.g. the driveshaft of an engine. In the prior art, there are various types of resolvers. In principle, a varying magnetic field is here generated by means of a coil and this field is detected by means of at least one further coil, the strength of the coupling between the coils varying in dependence on the position or angular position to be measured. In the case of the "variable reluctance resolver" (VR resolver), for example, only one exciter coil is used and there are two measuring coils which generate position-dependent signals. German patent application DE 10 2011 078 583 A1, for example, discloses an evaluation of resolver sensor signals in a vehicle. For this purpose, a resolver picks up a rotating movement of a rotor and a processor element processes the sinusoidal and cosinusoidal output signals of the resolver.

The invention is based on such a resolver, the exciter signal being sinusoidal and typically having a frequency of 10 kHz. The two measuring coils are, as a rule, positioned orthogonally with respect to one another and are designated as sinusoidal and cosinusoidal coil. By means of the two measurement signals, the angle of the object being measured can be unambiguously determined.

For example, the exciter signal for the exciter coil can be provided by two push-pull output stages, one each for the two terminals of the exciter coil. The output signals of the two output stages are then phase-shifted by 180° to one another and the exciter signal effective for the exciter coil is the differential voltage between the outputs of the two output stages.

However, there is also a possibility of operating the exciter coil by only one output stage. The second terminal of the exciter coil is then applied either directly or via a capacitor to a fixed potential, e.g. ground potential.

At the receiver coils, an alternating-voltage signal having the same frequency as the exciter signal is then produced, the amplitude of which, however, is modulated in accordance with the position of the rotor, the signal at the cosinusoidal coil being phase-shifted by 90° with respect to the signal at the sinusoidal coil.

Resolvers are frequently used for controlling permanently excited synchronism machines (PSM) and electrically excited synchronism machines (ESM) which, e.g., are used as drive for hybrid and electric vehicles. Such a control requires the knowledge of the current angle position of the rotor. The control of asynchronous machines (ASM) requires the knowledge of the current frequency of the drive.

Because of their ruggedness, resolvers are preferably used for these purposes in motor vehicles even if there are alternative sensors, e.g. digital angle transducers or sensors based on the eddy current effect.

For sensors in the motor car area, possibilities for the diagnosis of possible faults are desirable. For resolvers as are the subject matter of the present application, a possible fault to be diagnosed is an open line to the resolver coil for the sinusoidal or cosinusoidal signal, i.e. in the case of at least one of the two coils, one of its two terminals no longer has an electrical connection to the drive circuit or there is a cable fracture within one of the two coils.

One possibility of diagnosing such a fault consists in that one of the two signal lines is drawn into the clipping range by a corresponding hardware circuit, i.e. the voltage at the ends of the potentially interrupted signal line is drawn into the overdrive range of the associated AD converter. Such a diagnosis is not sufficiently reliable, however, because clipping can also occur for other reasons.

SUMMARY OF THE INVENTION

The method for detecting an open line of the receiver coil of a resolver this can be the sinusoidal receiver coil or the cosinusoidal receiver coil firstly comprises the provision of a pull-up resistor and of a pull-down resistor at the two terminals for this signal line at the control device of the resolver. These resistors are connected to different direct voltages compared with ground at their other end. For the fault detection, the differential voltage between the signal lines, which represents the resolver signal, is monitored permanently in such a manner that it is required periodically at two sampling times located symmetrically with respect to the center of the exciter period at which this voltage difference essentially exhibits the same amount but has different signs.

By forming the mean value of the measurement values $U_R$ and $U_F$ for these two sampling times $$\tfrac{1}{2}*(U_R+U_F)$$

an offset value can thus be determined which is close to zero when there is no fault. In the case of a fault, however, when the line of the receiver coil is open, the voltage difference between their two terminals, and thus the voltage value detected by the AD converter, is the difference of the potentials to which the pull-up and pull-down resistor are connected: if therefore this voltage difference is great, the fault case exists and the fault can be identified by comparing the offset value to a threshold value.

Another aspect of the invention consists in a circuit which implements this method. The circuit is based on the circuit to be examined which comprises a control device with a processor and power stages for providing the signal for the exciter line, also the exciter line to the exciter coil of the resolver and the signal lines, to be diagnosed, for the sinusoidal and cosinusoidal signal which couple the resolver to the control device. The circuit also comprises, both for the sinusoidal and for the cosinusoidal line, one AD converter each which are connected to the terminals for the signal lines and the outputs of which can be read by the processor and, in particular, can be evaluated for the engine control.

For the fault diagnosis, the circuit comprises for each receiver coil one pull-up and one-down resistor each which has a high resistance compared with the internal resistance of the receiver coils and is connected in each case with one end to the respective terminal of the receiver coil and is connected with the other terminal to a fixed potential with respect to ground, the difference of the two potentials having for each coil a voltage value which lies within the measuring range (input signal range) of the AD converters.

The advantage of the invention consists in that the fault to be diagnosed can be distinguished precisely from other faults (pinpointing diagnosis).

In particular, clipping of an AD converter as used for diagnosis in the prior art, can also be based on another fault. The diagnosis is also very quick because a reliable fault diagnosis is available after only a few periods of the exciter signal having a typical duration of 0.1 ms and, if necessary, suitable measures can be taken. Thus, in particular, requirements for sensors in the motor car field with regard to functional reliability and with regard to OBD (on-board diagnosis) functionality are met.

It is also advantageous if the method according to the invention can be implemented with minimum supplementation of the usual hardware of a resolver drive.

If the difference of the potentials to which the pull-up and the pull-down resistor are connected lies within the range of measurement of the AD converter, the fault case to be detected does not generate any clipping but a constant value at the DA converter which advantageously eliminates other causes.

If the pull-up resistor and the pull-down resistor are of high resistance in comparison with the ohmic resistance of the receiver coil, the control device is advantageously not impaired or strained in any way.

If the calculating of the offset value in the fault determination only includes the measurement values at the two times R and F of only a single exciter period, the result is advantageously available particularly quickly, only after about 0.1 ms.

If, in contrast, it is excluded that extraordinary engine conditions, e.g. extremely severe acceleration—lead to a difference in the amplitudes at the sampling times being detected as faults, the measurement values at sampling times from two or more exciter periods can also be included.

It can also be advantageous for the production of the circuit if the pull-up resistors and pull-down resistors are integrated in the control device or if one of the direct-voltage potentials is the ground potential.

DETAILED DESCRIPTION

Figure 1:
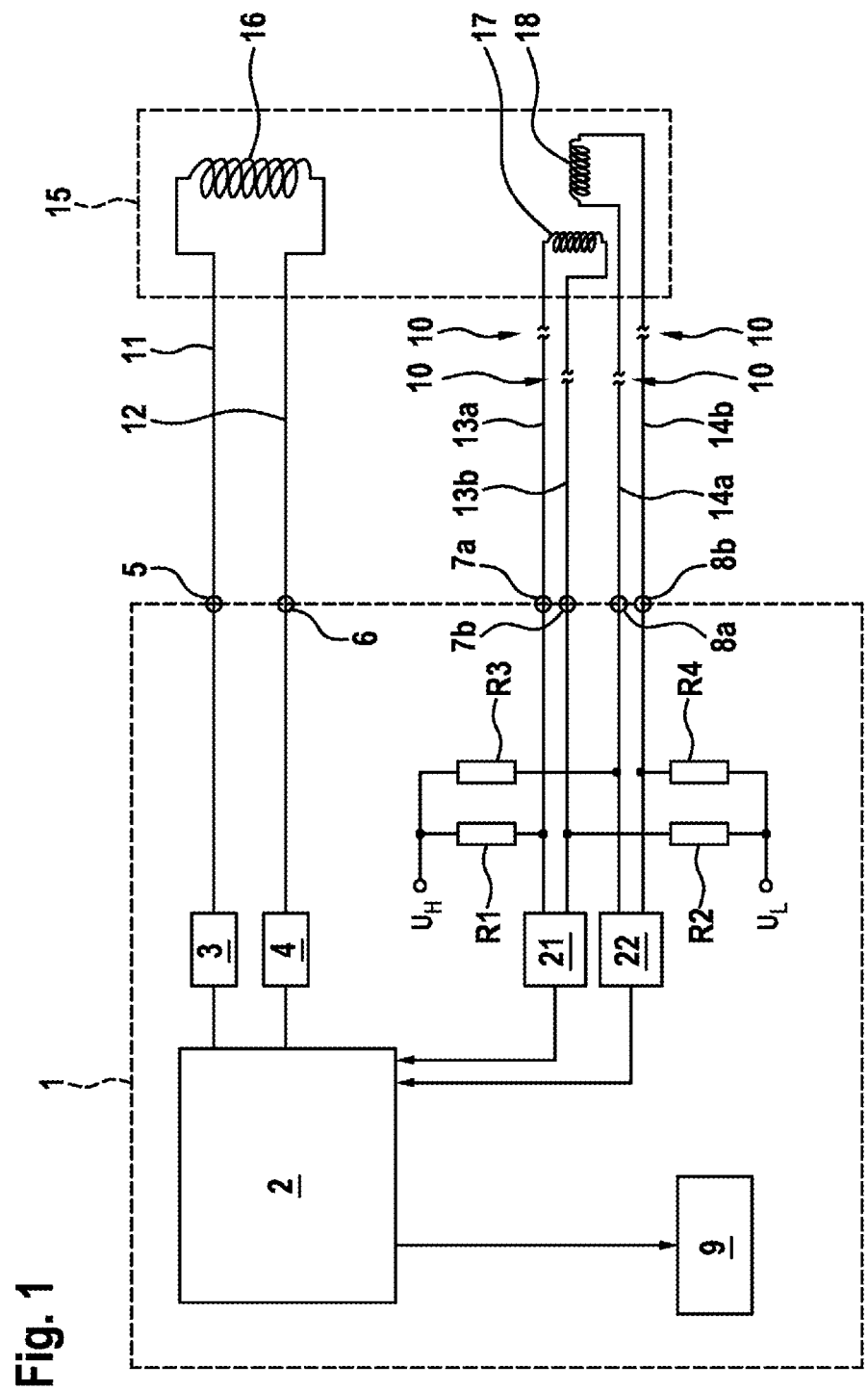
FIG. 1 shows a circuit according to an illustrative embodiment of the invention.

In FIG. 1, the control device 1 for the resolver 15 is in the center which can be integrated in the control device for a vehicle (not shown here). It has a processor 2 (or also uses one) which monitors the correct sequence of all resolver functions to be controlled and also indicates malfunctions, if necessary.

The control device 1 controls, in particular, power stages 3 and 4 for providing the sinusoidal exciter signal for the exciter coil 16 of the resolver 15 at the first terminals 5 and 6. At the second terminals 7a, 7b and 8a, 8b, the signals of the sinusoidal coil 17 and of the cosinusoidal coil 18, which represent the instantaneous angular position of the object being measured (e.g. the shaft of the engine), pass to the control device 1 and, after conversion in the AD converters 21 and 22, can be processed further as digital signal by a software.

The resolver exciter lines 11 and 12 represent the connection from the first terminals of the control device 1 to the resolver 15, i.e. to its exciter coil 16. From the sinusoidal coil 17 and the cosinusoidal coil 18 of resolver 15, the signal lines 13a, 13b, 14a and 14 go to the second terminals 7a, 7b, 8a and 8b of the control device 1. These lines must be monitored with respect to a break which is indicated by the potential breaks 10 in FIG. 1.

Furthermore, pull-up resistors $R_1$ and $R_3$ are provided which are connected with their one end to one of the terminals 7a and 8a for one of the lines 13a and 14a to the sinusoidal coil 17 and to the coinusoidal coil 18. At their other end, the pull-up resistors $R_1$ and $R_3$ are connected to a first direct-voltage potential $U_H$. With the other terminals 7b and 8b for lines 13b and 14b to the sinusoidal coil 17 and the cosinusoidal coil 18, pull-down resistors $R_2$ and $R_4$ are connected with their one end and with their other end to a second direct-voltage potential $U_L$. In this context, the second direct-voltage potential $U_L$ is lower than the first direct-voltage potential $U_H$ and the voltage difference $U_H$–$U_L$ can lie within the measuring range of AD converters 21 and 22.

Figure 2:
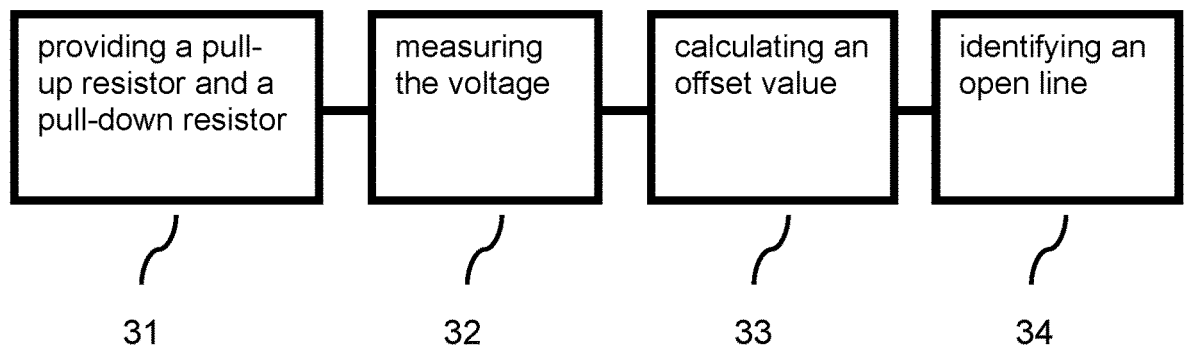
FIG. 2 diagrammatically explains the steps for carrying out the method according to an illustrative embodiment of the invention.

The method for detecting an open line 10 of a receiver coil 17 or 18 of a resolver 16, as explained symbolically in FIG. 2, is identical for both receiver coils. In step 31, it is based on providing the aforementioned pull-up resistor $R_1$ and $R_3$, respectively, and the pull-down resistor $R_2$ and $R_4$ at terminals 7a and 8a and 7b, respectively, and 8b at the control device 1 for signal lines 13a and 14a and 13b, respectively, and 14b.

The next method step is the measuring 32 of the voltage between the two signal line terminals 7a and 7b and 8a and 8b, respectively, of the respective receiver coil at two sampling times R and F located symmetrically to the center of the exciter period. These measurements can take place with the AD converters 21 and 22 in addition to the operational measurements of the angular position of the rotor or the processor 2 can also select the measurement values at times R and F from these measurement values. This is followed by the calculating 33 of an offset value $U_{DC}$ by forming a mean value which comprises the measurement values $U_R$, $U_F$ at the two sampling times R and F of an exciter period $$U_{DC}=\tfrac{1}{2}*(U_R+U_F).$$

Figure 3:
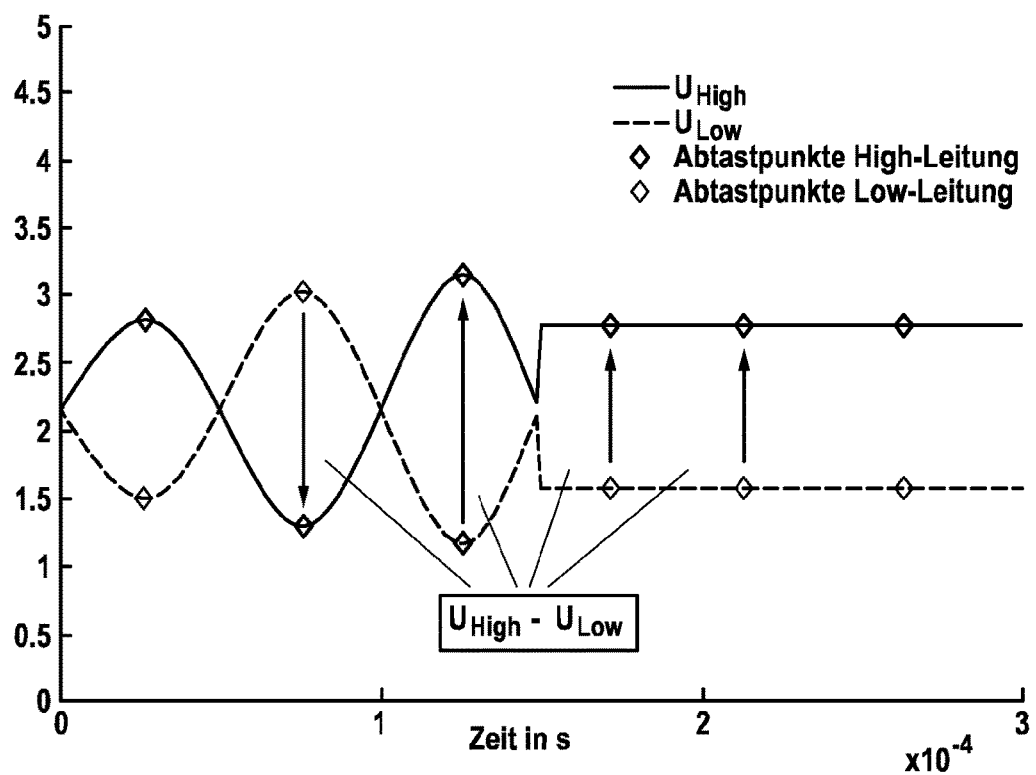
FIG. 3 shows details in the variation with time of the voltages on occurrence of the fault case.

FIG. 3 explains the significance of this value. It shows the variation with time of potential $U_{High}$ and $U_{Low}$ at the two terminals 7a and 7b of the sinusoidal coil in the left-hand half of the figure before and on the right after occurrence of the fault of an open signal line. The voltage difference between the two signal lines 13a and 13b, designated as "high" and "low" in FIG. 3, is indicated by vertical arrows. In faultless operation (on the left) it is caused by the exciter coil 16 and its variable coupling via the rotor. Since the two terminals 7a and 7b of the signal lines are run to the AD converter 21, it is only this difference which is the measurement value of the signal of the sinusoidal coil which is processed further by the processor. The potential of the two lines at terminals 7a and 7b to ground is additionally determined by the pull-up resistor $R_1$ and the pull-down resistor $R_2$ and the potentials $U_H$ and $U_L$ to which they are connected. These resistors act as voltage dividers and lead to an offset for the potentials (in FIG. 3, the potentials are designated as $U_{High}$ and $U_{Low}$), the offset value being about 2.1 V in the example shown in FIG. 3. The comparatively low ohmic resistance of the receiver coil 17 acts as short circuit with respect to this voltage divider and prevents the formation of a significant voltage difference between $U_{High}$ and $U_{Low}$ beyond the measurement signal.

If then the voltage difference between times R and F, shown by the two arrows on the left, which is switched to the AD converter for the fault detection is added up, a value close to zero is obtained. It is only if the amplitude of the resolver signal changes, which may occur under certain operating conditions, that this sum differs from zero; but it still remains small, particularly smaller than a predetermined threshold value $C_S$. In addition, the possibility exists to include the measurement values at times R and F from one or more of the preceding exciter periods, in the formation of the mean value in order to eliminate this risk of a false diagnosis.

If then the fault of an open signal line occurs (on the right in FIG. 3), the short-circuit effect of the receiver coil 17 disappears so that no more voltage divider is formed by the pull-up resistor $R_1$ and the pull-down resistor $R_2$. The potentials of the two line terminals 7a and 7b and, respectively, 8a and 8b are instead now pulled to the direct voltage potential $U_H$ and $U_L$, respectively, via the pull-up resistor $R_1$ and the pull-down resistor $R_2$ to the direct-voltage potential $U_H$ and $U_L$, respectively, and the voltage difference detected by the AD converter (in FIG. 4, e.g.: 2.8 V−1.6 V=1.2 V) between terminals 7a (high) and 7b (low) indicated by arrows in FIG. 3, here, too, is a fixedly positive value $U_H$−$U_L$ which respectively exceeds the threshold value $C_S$. Identifying 34 (see FIG. 2) an open line of one of the signal lines 13a, 13b of the sinusoidal coil therefore takes place by observing whether the offset value $U_{DC}$ at the associated AD converter 21 exceeds the threshold value $C_S$ without a clipping of an AD converter having to take place. This correspondingly applies to the signal lines 14a and 14b of the cosinusoidal coil 18.

On the basis of the finding of whether the offset value $U_{DC}$ exceeds the threshold value $C_S$ and thus whether an open signal line 10 is diagnosed, the required measures can take place very rapidly, particularly the finding of the fault is indicated or stored, respectively, with a display and/or storage device 9. In this context, the openline can be designated, e.g., by its color or its reference number.

The invention claimed is:

1. A method for detecting an open signal line of a receiver coil of a resolver, the method comprising:
   providing a pull-up resistor and a pull-down resistor which are connected with their one end to terminals for the signal lines;
   measuring the voltage between the two signal line terminals of the receiver coil at least two sampling times located symmetrically with respect to the center of the exciter period;
   calculating an offset value by forming a mean value which comprises the measurement values at the two sampling times of an exciter period; and
   identifying an open line when the offset value exceeds a threshold value.

2. The method as claimed in claim 1, wherein the pull-up resistor and the pull-down resistor are supplied at their other end with a voltage potential which differ by a constant amount from the other which is smaller than the measuring range of the AD converter for the measurement values of the receiver coil.

3. The method as claimed in claim 1, in which the calculating of the offset value takes into consideration the measurement values at the two sampling times of only one individual exciter period.

4. The method as claimed in claim 1, in which the calculating takes into consideration the measurement values at the two sampling times of a plurality of preceding exciter periods.

5. Circuit for detecting an open line of a receiver coil of a resolver, the circuit comprising:
   a control device with a processor, power stages, first terminals for providing signals at the exciter lines to the exciter coil of the resolver and second terminals for connecting the signal lines for the signals of the sinusoidal and the cosinusoidal coil;
   two AD converters which are connected to the second terminals of the control device and the outputs of which can be read and evaluated by the processor;
   the exciter lines which couple the first terminals to the exciter coil of the resolver;
   the signal lines to be diagnosed for the sinusoidal and cosinusoidal signals provided by the resolver, which couple the resolver to the second terminals of the control device;
   pull-up resistors which are connected with their one end to one of the terminals for the lines of the sinusoidal coil and the cosinusoidal coil and with their other end to a first direct-voltage potential; and
   pull-down resistors which are connected with their one end to the other one of terminals for the lines of the sinusoidal coil and the cosinusoidal coil and with their other end to a second direct-voltage potential, the second direct-voltage potential being lower than the first direct-voltage potential, in such a manner that the voltage difference lies between and in the measuring range of the AD converters; and a display or storage device for displaying or storing the information identified by the processor, into which the positive detection of an open line of one of the receiver coils of a resolver is included.

6. The circuit as claimed in claim 5, wherein the pull-up and the pull-down resistors are integrated into the control device.

7. The circuit as claimed in claim 5, wherein the resistance values of the pull-up resistors and the pull-down resistors are large compared with the ohmic resistance of the sinusoidal coil and of the cosinusoidal coil.

* * * * *